(12) United States Patent
Kawachi

(10) Patent No.: US 9,847,350 B2
(45) Date of Patent: Dec. 19, 2017

(54) LIQUID CRYSTAL DISPLAY DEVICE AND METHOD OF MANUFACTURING A LIQUID CRYSTAL DISPLAY DEVICE

(71) Applicant: Panasonic Liquid Crystal Display Co., Ltd., Himeji-shi, Hyogo (JP)

(72) Inventor: Genshiro Kawachi, Osaka (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 332 days.

(21) Appl. No.: 14/539,506

(22) Filed: Nov. 12, 2014

(65) Prior Publication Data

US 2015/0069388 A1   Mar. 12, 2015

Related U.S. Application Data

(63) Continuation of application No. PCT/JP2013/003072, filed on May 14, 2013.

(30) Foreign Application Priority Data

Jun. 7, 2012  (JP) .................................. 2012-130258

(51) Int. Cl.
   *G02F 1/13* (2006.01)
   *H01L 27/12* (2006.01)
   *G02F 1/1368* (2006.01)
   *G02F 1/1343* (2006.01)

(52) U.S. Cl.
   CPC ........ *H01L 27/1225* (2013.01); *G02F 1/1368* (2013.01); *G02F 1/134363* (2013.01); *H01L 27/127* (2013.01); *H01L 27/1259* (2013.01)

(58) Field of Classification Search
   CPC ........... H01L 27/124; H01L 27/1214–27/1296
   See application file for complete search history.

(56) References Cited

U.S. PATENT DOCUMENTS

| 2002/0056838 | A1 | 5/2002 | Ogawa |
| 2011/0181824 | A1 | 7/2011 | Nagano |
| 2014/0367677 | A1 | 12/2014 | Miyamoto et al. |

FOREIGN PATENT DOCUMENTS

| JP | 63-097919 | 4/1988 |
| JP | 2003-050405 | 2/2003 |
| JP | 2010-147351 | 7/2010 |
| JP | 2010-230744 | 10/2010 |
| JP | 2010-263064 | 11/2010 |
| JP | 2011-154281 | 8/2011 |
| WO | 2013/115052 | 8/2013 |

*Primary Examiner* — Mariceli Santiago
(74) *Attorney, Agent, or Firm* — Hamre, Schumann, Mueller & Larson, P.C.

(57) ABSTRACT

Provided is a liquid crystal display device, including: an array substrate; a plurality of pixels sectioned by video signal lines and scanning signal lines formed on the array substrate; a TFT arranged for each of the plurality of pixels; and a pixel electrode arranged inside each of the plurality of pixels. The TFT includes a channel semiconductor layer and the pixel electrode that are formed of a seamless layer made of an oxide semiconductor. The pixel electrode has an electrical conductivity larger than an electrical conductivity of the channel semiconductor layer under a state in which a gate voltage is not applied.

9 Claims, 7 Drawing Sheets

LIQUID CRYSTAL DISPLAY DEVICE AND METHOD OF MANUFACTURING A LIQUID CRYSTAL DISPLAY DEVICE

CROSS-REFERENCE TO RELATED APPLICATION

This application is Bypass Continuation of international patent application PCT/JP2013/003072, filed: May 14, 2013 designating the United States of America, the entire disclosure of which is incorporated herein by reference. Priority is claimed based on Japanese patent application JP2012-130258, filed: Jun. 7, 2012. The entire disclosure of Japanese patent application JP2012-130258 is incorporated herein by reference in its entirety.

TECHNICAL FIELD

This application relates to a liquid crystal display device and a method of manufacturing a liquid crystal display device.

BACKGROUND

In recent years, indium gallium zinc oxide (IGZO), which is one type of transparent amorphous oxide semiconductors (TAOS), has attracted attention because of its high electrical conductivity, and has been discussed to be used as a material for forming a thin film transistor (TFT) to be used in an active matrix liquid crystal display device or an OLED display device.

Japanese Patent Application Laid-open No. 2010-263064 discloses a method of manufacturing a thin film transistor as follows. A light-shielding gate electrode is formed on a TFT semiconductor layer formed of IGZO through intermediation of a gate insulating film. The semiconductor layer is irradiated with ultraviolet rays from the gate electrode side, to thereby form amorphous source and drain regions having a higher conductivity than that before irradiation.

In the manufacture of the liquid crystal display device, if the structure of the TFT can be simplified, advantageous effects can be expected, such as reduction in manufacturing cost, and improvement in aperture ratio or increase in pixel resolution due to reduction in size of a TFT occupying region.

This application has been made by focusing on the property of IGZO or a material similar thereto, and has an object to simplify the structure of the TFT to be used in the liquid crystal display device.

SUMMARY

This application has various aspects, and representative aspects may be summarized as follows.

(1) A liquid crystal display device, including: an array substrate; a plurality of pixels sectioned by video signal lines and scanning signal lines formed on the array substrate; a TFT arranged for each of the plurality of pixels; and a pixel electrode arranged inside each of the plurality of pixels, the TFT including a channel semiconductor layer and the pixel electrode that are formed of a seamless layer made of an oxide semiconductor, the pixel electrode having an electrical conductivity larger than an electrical conductivity of the channel semiconductor layer under a state in which a gate voltage is not applied.

(2) The liquid crystal display device according to Item (1), in which the oxide semiconductor is a metal oxide containing at least one metal element selected from the group consisting of In, Ga, Zn, Sn, Cu, and Cd.

(3) The liquid crystal display device according to Item (1) or (2), in which the channel semiconductor layer overlaps with corresponding one of the scanning signal lines through intermediation of a gate insulating film in plan view, and in which each of the scanning signal lines functions as a gate electrode of the TFT.

(4) A method of manufacturing a liquid crystal display device, including: preparing an array substrate; forming a scanning signal line on the array substrate; forming a gate insulating film on the array substrate; forming a layer made of an oxide semiconductor on the array substrate; forming a video signal line so as to overlap with a part of the layer made of the oxide semiconductor; and forming a pixel electrode by radiating an energy ray to the part of the layer made of the oxide semiconductor.

(5) The method of manufacturing a liquid crystal display device according to Item (4), in which the layer made of the oxide semiconductor has a part that overlaps with the scanning signal line through intermediation of the gate insulating film in plan view.

(6) The method of manufacturing a liquid crystal display device according to Item (4) or (5), in which the forming of the pixel electrode by radiating the energy ray is carried out after bonding the array substrate and a color filter substrate to each other so as to sandwich a liquid crystal layer.

(7) A liquid crystal display device, including: an array substrate; a plurality of pixels sectioned by video signal lines and scanning signal lines formed on the array substrate; a common electrode formed of a transparent electrode arranged inside each of the plurality of pixels; a TFT arranged for each of the plurality of pixels; a pixel electrode arranged inside each of the plurality of pixels so as to overlap with the common electrode through intermediation of an insulating layer; and a shielding electrode that overlaps with corresponding one of the video signal lines through intermediation of an insulating layer, the TFT including a channel semiconductor layer and the pixel electrode that are formed of a seamless layer made of an oxide semiconductor.

According to the aspect of Item (1), (2), or (7) of this application, the structure of the TFT can be simplified in the liquid crystal display device.

According to the aspect of Item (3) of this application, the aperture ratio of the pixel can be improved, or the pixel resolution can be increased without reducing the aperture ratio of the pixel.

According to the aspect of Item (4) of this application, it is possible to manufacture the liquid crystal display device including the TFT having a simplified structure.

According to the aspect of Item (5) of this application, the pixel electrode can be formed without preparing a separate light shielding layer or mask for blocking ultraviolet rays.

According to the aspect of Item (6) of this application, only the conductivity of the pixel electrode part can be selectively increased without adversely affecting the conductivity of the channel part of the TFT. Further, the radiation is performed after the liquid crystal cell is assembled, and thus the increased conductivity of the pixel electrode part can be stably maintained.

DETAILED DESCRIPTION

Now, embodiments of this application are described with reference to the drawings.

Figure 1:
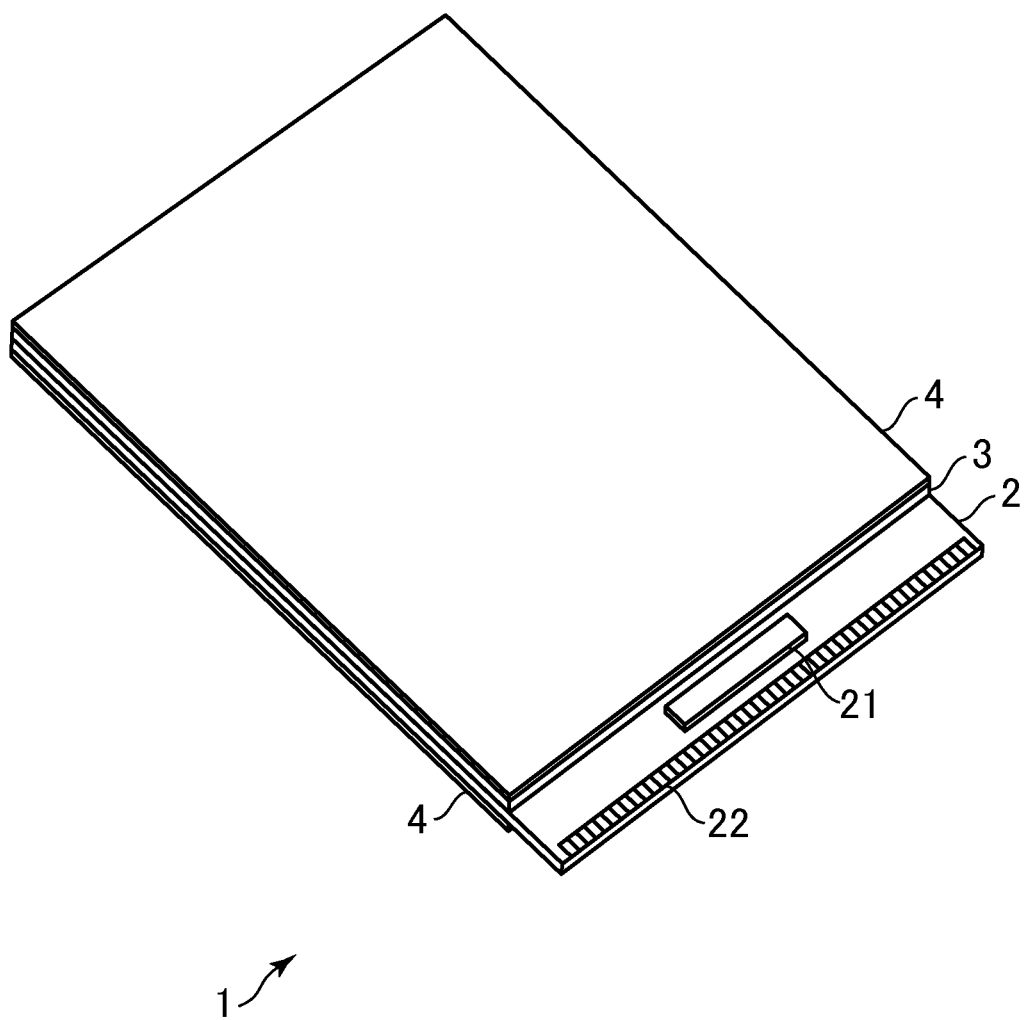
FIG. 1 is an external perspective view of a liquid crystal display device according to an embodiment of this application.

FIG. 1 is an external perspective view of a liquid crystal display device 1 according to an embodiment of this application. The liquid crystal display device 1 has a structure in which a liquid crystal material with a thickness of about several micrometers is sandwiched between an array substrate 2 and a color filter substrate 3. A sealing material formed along an outer periphery of the color filter substrate 3 bonds the color filter substrate 3 to the array substrate 2 so as to seal the liquid crystal material without leakage.

The array substrate 2 is a glass substrate including, on a front surface thereof, a large number of switching elements and pixel electrodes formed in matrix. When TFTs are used as the switching elements, the array substrate 2 is also called a TFT substrate. The array substrate 2 has a larger outer shape than that of the color filter substrate 3 as illustrated in FIG. 1, and at least one side of the array substrate 2 is extended out with respect to the color filter substrate 3 so that the front surface thereof is exposed. On the exposed part of the front surface of the array substrate 2, a driver IC 21 is mounted, which is a control circuit for controlling on and off of the large number of TFTs and video signals to be applied to the respective pixel electrodes. In addition, on the exposed part, a connection terminal 22 is formed so as to electrically connect the liquid crystal display device 1 to an external apparatus via, for example, a flexible printed circuit (FPC) or the like.

The color filter substrate 3 is a glass substrate including thin films colored with red, green, and blue for respective pixels that serve as units for the liquid crystal display device 1 to form an image. The colored thin films are formed at positions corresponding to the pixel electrodes formed on the array substrate 2.

Further, polarizing films 4 are bonded to the back surface of the array substrate 2 and the front surface of the color filter substrate 3.

Note that, in the embodiment described above, the liquid crystal display device 1 is a so-called transmissive liquid crystal display device, and the array substrate 2 and the color filter substrate 3 are transparent substrates made of glass or the like. When the liquid crystal display device 1 is a reflective liquid crystal display device, the array substrate 2 and the color filter substrate 3 do not need to be transparent, and materials therefor are not limited to glass. Further, in the embodiment described above, the liquid crystal display device 1 is a full-color display device, and hence the color filter substrate 3 includes the thin films colored with red, green, and blue. However, the combination of the colors may differ. Further, the liquid crystal display device 1 may be a monochrome display device in which a thin film colored with a single color is used or the colored thin film is omitted.

Figure 2:
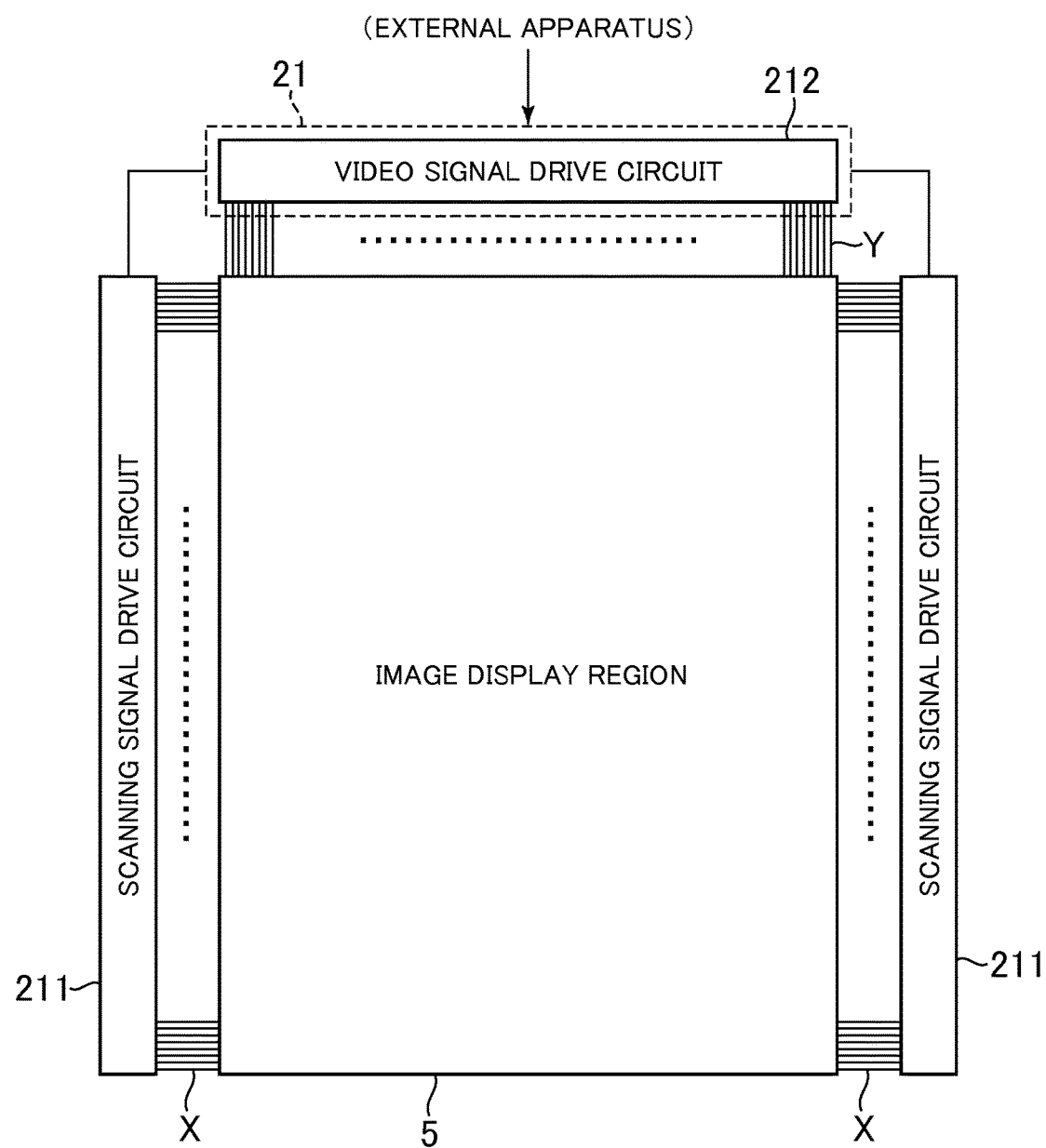
FIG. 2 is a view illustrating configurations of circuits formed on an array substrate of the liquid crystal display device according to an embodiment of this application.

FIG. 2 is a view illustrating configurations of circuits formed on the array substrate 2 of the liquid crystal display device 1 according to the embodiment of this application.

On the array substrate 2, a rectangular image display region 5 in which a large number of pixels are arranged in matrix is formed. Note that, the resolution and the horizontal and vertical lengths of the image display region 5 are determined depending on the application of the liquid crystal display device 1. The liquid crystal display device 1 exemplified in this embodiment has a vertically long shape (the horizontal length is smaller than the vertical length). This is because the liquid crystal display device 1 is assumed to be used as a display device for a personal digital assistance such as a so-called smartphone. Depending on the application, the image display region 5 may have a horizontally long shape (the horizontal length is larger than the vertical length), or a shape in which the horizontal length is the same as the vertical length.

On the array substrate 2, a plurality of scanning signal lines X and a plurality of video signal lines Y are formed so as to cross the image display region 5. The scanning signal lines X and the video signal lines Y are formed orthogonal to each other so as to section the image display region 5 in matrix. A region surrounded by two adjacent scanning signal lines X and two adjacent video signal lines Y corresponds to one pixel.

Figure 3:
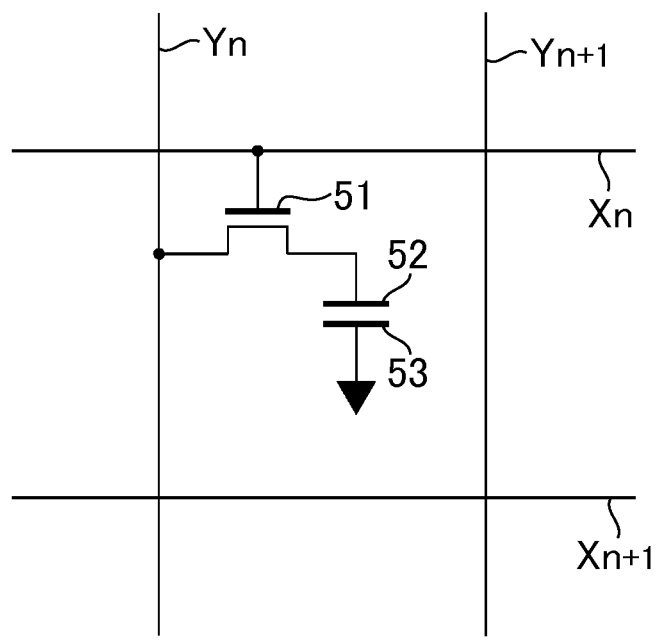
FIG. 3 is a circuit diagram illustrating one pixel formed in an image display region.

FIG. 3 is a circuit diagram illustrating one pixel formed in the image display region 5. A region illustrated in FIG. 3, which is surrounded by scanning signal lines Xn and Xn+1 and video signal lines Yn and Yn+1, corresponds to one pixel. The pixel referred to here is driven by the video signal line Yn and the scanning signal line Xn. A TFT 51 is formed in each pixel. The TFT 51 is turned on based on a scanning signal input from the scanning signal line Xn. The video signal line Yn applies a voltage (signal representing a grayscale value of each pixel) to a pixel electrode 52 of the corresponding pixel via the TFT 51 in the on state.

Further, a common electrode 53 is formed so as to correspond to the pixel electrode 52 so that a capacitor is formed via a liquid crystal layer sandwiched and sealed between the array substrate 2 and the color filter substrate 3. The common electrode 53 is electrically connected to a common potential. Therefore, based on the voltage applied to the pixel electrode 52, an electric field between the pixel electrode 52 and the common electrode 53 changes, to thereby change the alignment state of liquid crystal in the liquid crystal layer. In this manner, a polarization state of a light beam that transmits through the image display region 5 is controlled. The transmittance of the light beam that transmits through the liquid crystal display device 1 is determined based on the relationship between the polarization direction to be controlled by the liquid crystal layer and the polarization directions of the polarizing films 4 bonded to the array substrate 2 and the color filter substrate 3. Each pixel functions as an element for controlling the light transmittance. Then, the light transmittance of each pixel is controlled based on input image data to display an image. Therefore, in the liquid crystal display device 1, a region in which the pixels are formed corresponds to the image display region 5 in which an image is displayed.

Note that, the substrate on which the common electrode 53 is formed differs depending on the system for driving the liquid crystal. For example, in a case of a system called in-plane switching (IPS), the common electrode is formed on the array substrate 2. Further, for example, in a case of a system called vertical alignment (VA) or twisted nematic (TN), the common electrode is formed on the color filter substrate 3. Although the system for driving the liquid crystal is not particularly limited in this application, the IPS system is employed in this embodiment.

Referring back to FIG. 2, the driver IC 21 is formed on at least one side of edges of the image display region 5, which are parallel to the scanning signal lines X, that is, on an upper side of the image display region in the illustrated example. The driver IC 21 inputs, from an external apparatus, various signals such as a power supply voltage, a ground voltage, a timing signal, and a video signal. Further, the driver IC 21 includes the video signal drive circuit 212 and is connected to the video signal lines Y.

Note that, in this embodiment, the common potential is the same as, but not always limited to, the ground potential. Further, the driver IC 21 is not necessarily a chip integrated circuit to be mounted on the array substrate 2 as illustrated in FIG. 1, and may be directly formed on the array substrate 2 by a so-called system on glass (SOG) method.

Scanning signal drive circuits 211 are formed on outer sides of the respective edges of the image display region, which are parallel to the video signal lines Y, to be connected to the scanning signal lines X. The scanning signal drive circuit 211 sequentially selects each of scanning connection lines 61 at the timing based on the timing signal input from the external apparatus, and applies, to the selected scanning connection line 61, a voltage (hereinafter referred to as "on-voltage") for turning on the TFT 51 (see FIG. 3). When the on-voltage is applied to the scanning signal line X, the TFTs 51 connected to the scanning signal line X are turned on.

Further, the video signal drive circuit 212 is connected to the video signal lines Y. The video signal drive circuit 212 applies, in synchronization with the selection of the scanning signal line X by the scanning signal drive circuit 211, a voltage corresponding to a video signal representing a grayscale value of each pixel to a source electrode of each of the TFTs 51 connected to the selected scanning signal line X.

Figure 4:
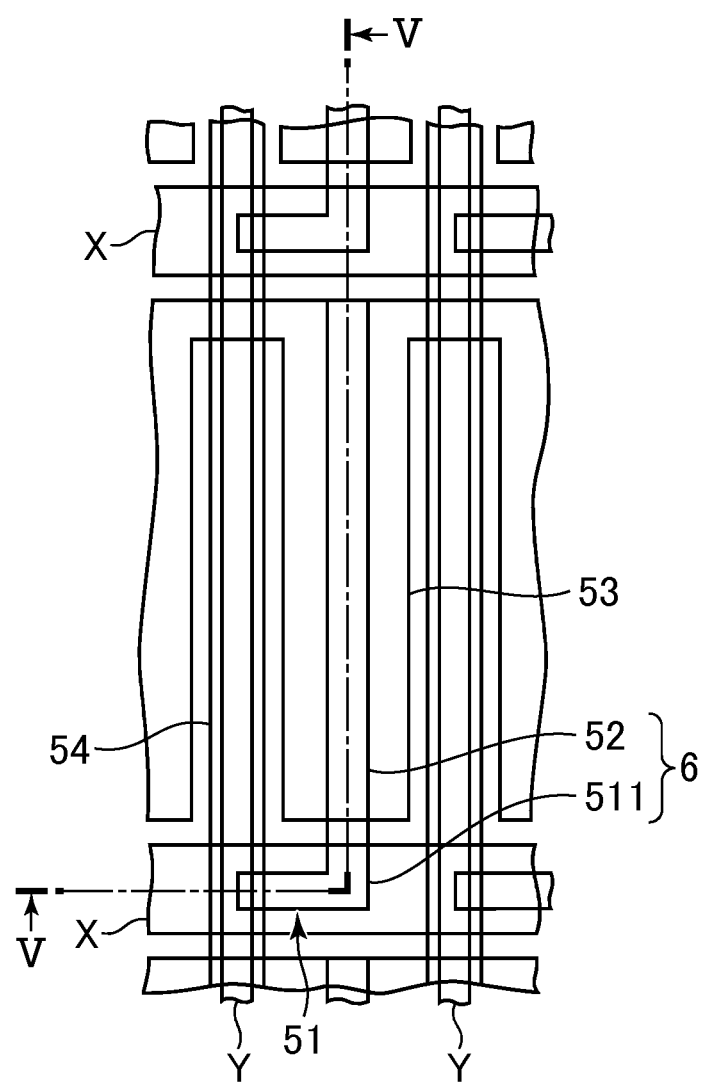
FIG. 4 is a partial enlarged view illustrating a planar structure of the pixel included in the image display region on the array substrate.

FIG. 4 is a partial enlarged view illustrating a planar structure of the pixel included in the image display region 5 on the array substrate 2. FIG. 4 illustrates one of a large number of pixels arranged in matrix, and a rectangular region surrounded by the scanning signal lines X and the video signal lines Y corresponds to one pixel. Note that, in FIG. 4, in order to clarify the positional relationship and shapes of the respective parts, outer shapes thereof are illustrated also in an overlapped part.

The scanning signal line X is a strip line continuously extending in the lateral direction in FIG. 4. In this embodiment, the scanning signal line X is a laminate film of indium tin oxide (ITO) and copper. Therefore, the scanning signal line X exhibits a light shielding performance. Further, the video signal line Y is a strip line of a copper thin film continuously extending in the vertical direction in FIG. 4 orthogonally to the scanning signal line X.

Inside the pixel, the pixel electrode 52 and the common electrode 53 formed at a position overlapping with the pixel electrode 52 are arranged. The pixel electrode 52 is an electrode having a strip shape extending in a direction parallel to the video signal line Y in the center portion of the pixel as illustrated in FIG. 4, or an electrode having a comb-shaped pattern. When an appropriate voltage is applied, a horizontal electric field is formed between the pixel electrode 52 and the common electrode 53. The common electrode 53 is a solid-pattern ITO thin film covering the entire pixel, and the common electrodes 53 adjacent to each other in the direction parallel to the scanning signal line X are connected to each other. Further, a video signal shielding electrode 54 is a strip line of an ITO thin film formed directly above and in parallel to the video signal line Y so as to overlap with the video signal line Y. The video signal shielding electrode 54 is connected to a common potential, and has a function of electrically shielding the video signal line Y so as to prevent a noise electric field from the video signal line Y from reaching the pixel electrode 52. With this, image deterioration to be caused by crosstalks of video signals is prevented during image display. Note that, the video signal shielding electrode 26 is not a necessary configuration, and may be omitted if unnecessary.

Further, a channel semiconductor layer 511 is formed at a position that overlaps with the scanning signal line X. The channel semiconductor layer 511 has a part that overlaps with the video signal line Y, and is continuously connected to the pixel electrode 52. Therefore, the channel semiconductor layer 511 has such an L-shape that the channel semiconductor layer 511 extends along the scanning signal line X from a part in which the scanning signal line X and the video signal line Y overlap with each other, and then bends to be connected to the pixel electrode 52. The channel semiconductor layer 511 is a part that acts as a channel of a field effect transistor. Therefore, apart represented by an outer shape of the channel semiconductor layer 511 functions as the TFT 51. Note that, as described later, in this embodiment, the pixel electrode 52 and the channel semiconductor layer 511 are a seamless oxide semiconductor layer 6 made of IGZO, which is one type of TAOS.

Figure 5:
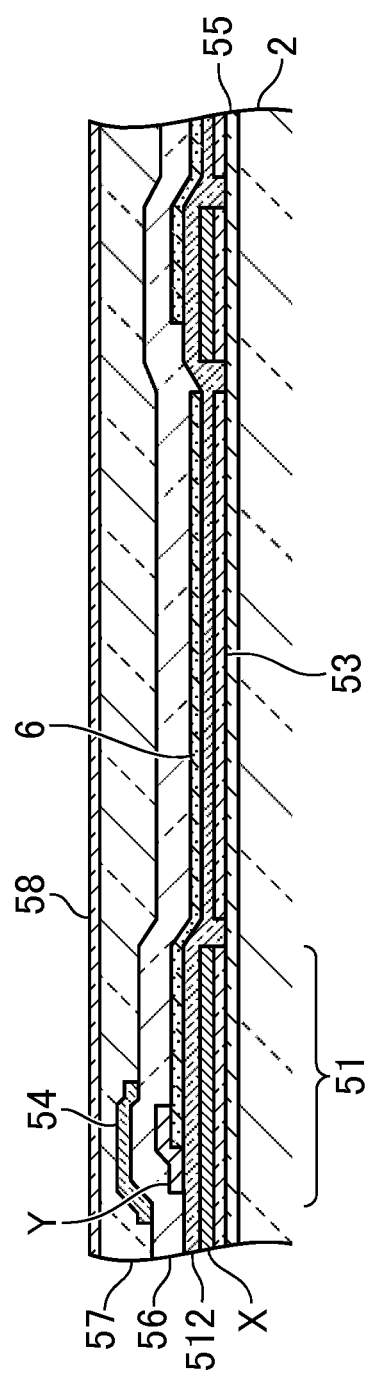
FIG. 5 is a sectional view taken along the line V-V of FIG. 4.

FIG. 5 is a sectional view taken along the line V-V of FIG. 4. FIG. 5 illustrates a cross section including the TFT 51 and the pixel electrode 52. On the array substrate 2, an underlayer 55 as an insulating layer is formed. On the upper surface of the underlayer 55, a transparent conductive film is formed of ITO or the like as the common electrode 53 and a base of the scanning signal line X. The scanning signal line X is obtained by further laminating copper on the transparent conductive film. The common electrode 53 and the scanning signal line X are covered with a gate insulating film 512, and the oxide semiconductor layer 6 is formed above the scanning signal line X and the common electrode 53 in a state of being insulated therefrom. A part of the oxide semiconductor layer 6, which is opposed to the scanning signal line X across the gate insulating film 512, functions as the channel semiconductor layer 511, and the remaining part thereof functions as the pixel electrode 52 (see FIG. 4). Further, the video signal line Y is formed so as to partially overlap with the part of the oxide semiconductor layer 6, which functions as the channel semiconductor layer 511, in a conductively connected state. The oxide semiconductor layer 6 and the video signal line Y are covered with a protective layer 56 as an insulating layer. Further, on the protective layer 56, the video signal shielding electrode 54 is formed of a transparent conductive film of ITO or the like so as to cover the video signal line Y in plan view. On the above-mentioned structure, a planarizing layer 57 as an insulating layer is further formed as necessary, and an alignment film 58 is further formed thereon.

In this structure, apart of the scanning signal line X, which is opposed to the channel semiconductor layer 511 of the oxide semiconductor layer 6, functions as a gate electrode of the TFT. Further, the video signal line Y connected to a part of the channel semiconductor layer 511 functions as a source (or drain) electrode. Then, in a general TFT, a drain electrode is formed in another part of the channel semiconductor layer 511 so as to be insulated from the source electrode. In the structure represented in this embodiment, however, a part of the oxide semiconductor layer 6, which is continuously connected to the channel semiconductor layer 511 and functions as the pixel electrode 52, functions as the drain electrode. In this structure, it is unnecessary to form a through hole for connecting the video signal line Y to the source electrode or a through hole for connecting the pixel electrode 52 to the drain electrode, and hence a through hole for connecting together the respective members forming the pixel is unnecessary. Therefore, the structure of the TFT 51 is simplified. Further, it is unnecessary to secure a space required to form the through hole, and hence the aperture ratio of the pixel can be improved, or the pixel size can be reduced to increase the resolution without reducing the aperture ratio. Further, the pixel can be formed without a step of forming the drain electrode or a step of forming the through hole, and hence the manufacturing cost may be reduced.

By the way, the oxide semiconductor layer 6 corresponds to the channel of the field effect transistor. Therefore, under a state in which the electric field from the gate electrode is not applied, the oxide semiconductor layer 6 has a large resistance and thus cannot cause the carrier to flow. Further, there is no part functioning as the gate electrode in the part of the oxide semiconductor layer 6, which functions as the pixel electrode 52, and hence the performance as the pixel electrode 52 cannot be obtained as it is. In view of this, an energy ray such as an ultraviolet ray or an electron ray is radiated from the lower side of FIG. 5, that is, from the back surface of the array substrate 2, to thereby form a carrier at a part of the oxide semiconductor layer 6, which is irradiated with the energy ray. In this manner, the electrical conductivity is increased to reduce the resistance to a level that enables achievement of the function as the pixel electrode 52. At this time, the scanning signal line X includes a copper layer, and exhibits a light shielding performance. Therefore, the characteristics of the channel semiconductor layer 511 do not change. Note that, the electrical conductivity of IGZO as the material of the oxide semiconductor layer 6 in this embodiment can be increased with ultraviolet rays. The material to be used as the oxide semiconductor layer 6 is not limited to IGZO, but the material is required to be capable of increasing its electrical conductivity through radiation of an energy ray that can be blocked. As such a material, there is given a metal oxide containing at least one metal element selected from the group consisting of In, Ga, Zn, Sn, Cu, and Cd. Further, when IGZO is used as the oxide semiconductor layer 6, a nitride film cannot be used as an insulating film to be brought into contact with IGZO (in this embodiment, the gate insulating film 512 and the protective layer 56), and hence it is necessary to use an insulating film not containing nitrogen, such as an $SiO_2$ film.

When the TFT 51 is a bottom gate TFT in which the gate electrode (that is, the scanning signal line X) is arranged in a lower layer as in this embodiment, the energy ray is radiated from the back surface of the array substrate 2. In a case of a top gate TFT having a reversed structure, when the energy ray is radiated from the front surface of the array substrate 2, it is unnecessary to separately form a light-shielding structure, which is advantageous. Further, in the bottom gate TFT, the energy ray can be radiated after the array substrate 2 and the color filter substrate 3 are bonded to each other while sandwiching the liquid crystal layer therebetween.

There is no heat treatment step at a high temperature of 200° C. or more after the array substrate 2 and the color filter substrate 3 are bonded to each other to assemble the liquid crystal cell. The conductivity of an oxide semiconductor such as IGZO increases through ultraviolet light radiation to enter a low resistance state, but such an oxide semiconductor has a property to return to the original high resistance state through a heat treatment step. Therefore, in order to stably maintain the state of the increased conductivity of the pixel electrode, it is required that a high-temperature heat treatment step be absent after the ultraviolet ray radiation. Therefore, in a process of manufacturing the liquid crystal display device 1 that is generally used at present, it is desired that the ultraviolet light radiation be performed not after the step of manufacturing the array substrate 2, but after the step of assembling the liquid crystal cell.

Note that, the sectional structure illustrated in FIG. 5 represents the liquid crystal display device 1 employing a so-called IPS system, and hence the common electrode 53 is arranged below the pixel electrode 52. However, in a case where the liquid crystal is driven by another system such as a VA system or a TN system, the common electrode 53 is formed on the color filter substrate 3 side, and hence is not formed on the array substrate 2.

Subsequently, the method of manufacturing the liquid crystal display device 1 is described focusing mainly on the array substrate 2 with reference to FIGS. 6A to 6G. Note that, FIGS. 6A to 6G each illustrate a cross section at the same position as FIG. 5.

First, the array substrate 2 is prepared.

Figure 6A:
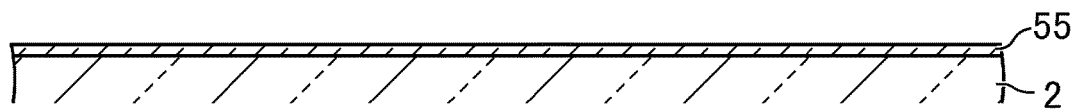
FIG. 6A is a view illustrating a method of manufacturing a liquid crystal display device.

Subsequently, the underlayer 55 serving as an insulating layer is formed on the array substrate 2 (FIG. 6A).

Figure 6B:
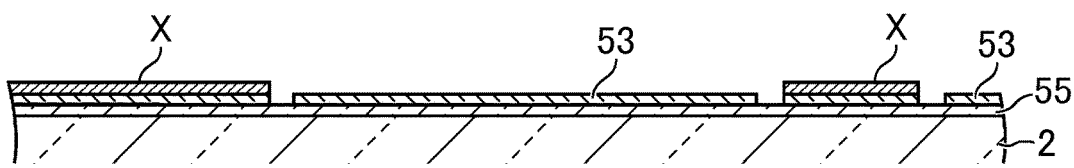
FIG. 6B is a view illustrating the method of manufacturing a liquid crystal display device.

Further, the common electrode 53 and the scanning signal line X are formed on the underlayer 55 (FIG. 6B). In this step, first, the common electrode 53 and the base of the scanning signal line X are formed of a transparent conductive film (ITO in this case), and then a copper film is laminated to a part to be formed into the scanning signal line X. Note that, when the liquid crystal of the liquid crystal display device 1 is driven by a system other than the IPS system, the formation of the common electrode 53 may be omitted in some cases.

Figure 6C:
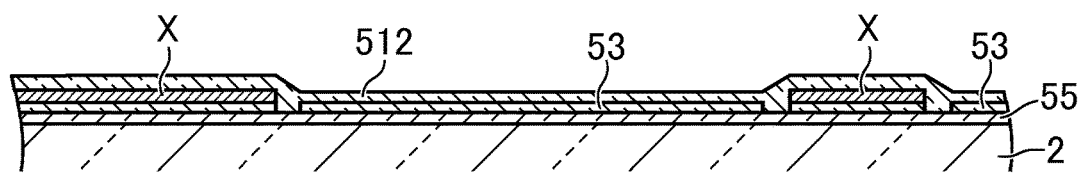
FIG. 6C is a view illustrating the method of manufacturing a liquid crystal display device.

Next, the gate insulating film 512 is formed (FIG. 6C). The gate insulating film 512 covers the entire surface of the image display region 5 including the common electrode 53 and the scanning signal line X.

Figure 6D:
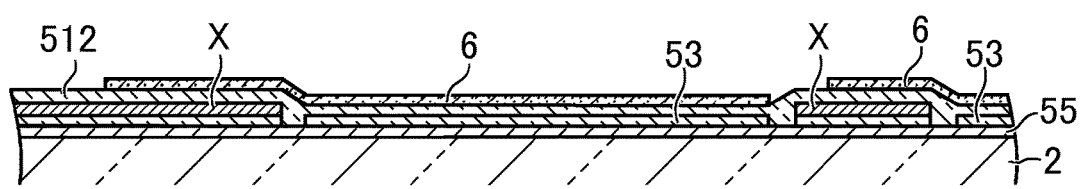
FIG. 6D is a view illustrating the method of manufacturing a liquid crystal display device.

Further, the oxide semiconductor layer 6 is formed on the gate insulating film 512 (FIG. 6D). At this time point, the oxide semiconductor layer 6 has no difference in electrical conductivity depending on parts.

Figure 6E:
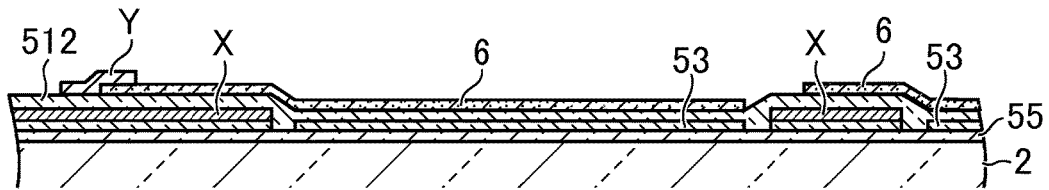
FIG. 6E is a view illustrating the method of manufacturing a liquid crystal display device.

Subsequently, the video signal line Y is formed so as to overlap with a part of the oxide semiconductor layer 6, in particular, a part that finally functions as the channel semiconductor layer 511 (FIG. 6E). The video signal line Y is a metal film of copper, aluminum, or the like. Note that, the part that finally functions as the channel semiconductor layer 511 is a part that overlaps with the scanning signal line X, and hence the video signal line Y overlaps with and is connected to the oxide semiconductor layer 6 in a part of a region in which the oxide semiconductor layer 6 and the scanning signal line X overlap with each other.

Figure 6F:
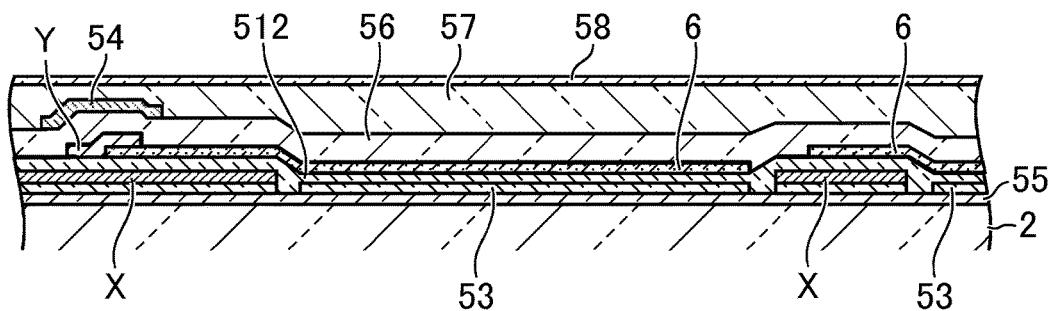
FIG. 6F is a view illustrating the method of manufacturing a liquid crystal display device.

Next, the protective layer 56 is formed, and the video signal shielding electrode 54 is further formed thereon. The planarizing layer 57 is formed as necessary, and then the alignment film 58 is formed (FIG. 6F). The alignment processing of the alignment film 58 may be performed by so-called rubbing or photo-alignment processing. When the photo-alignment processing is performed, it is necessary to select the wavelength of the ultraviolet rays and the total amount of irradiation energy so as to prevent the characteristics of the channel semiconductor layer 511 from changing by the polarized ultraviolet rays used in the photo-alignment processing.

Figure 6G:
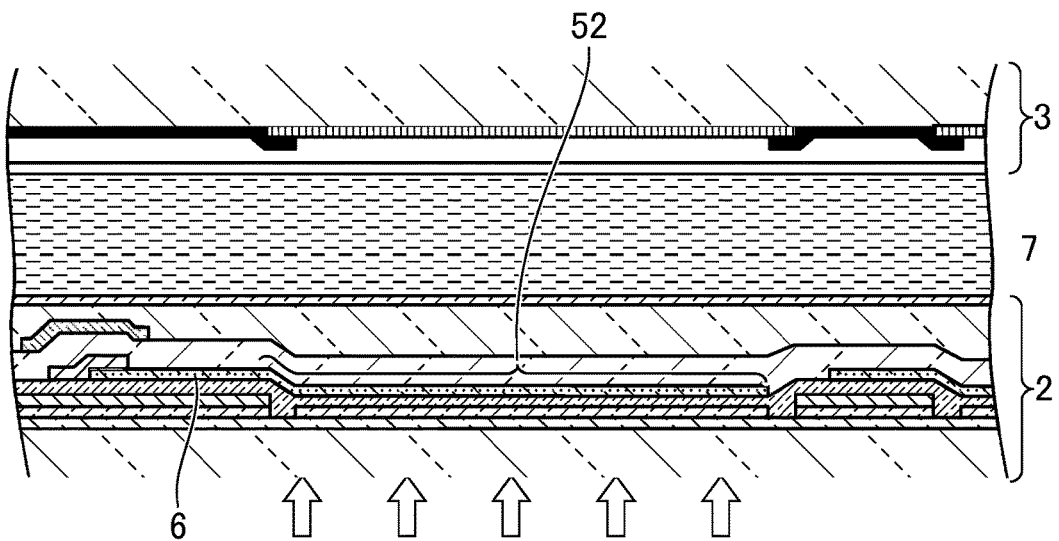
FIG. 6G is a view illustrating the method of manufacturing a liquid crystal display device.

With the above-mentioned processing, after the array substrate 2 and the color filter substrate 3 formed in a different step are bonded to each other while sandwiching a liquid crystal layer 7, an energy ray is radiated from the back surface of the array substrate 2 to change the characteristics of apart of the oxide semiconductor layer 6, to thereby form the pixel electrode 52 (FIG. 6G).

Note that, the description above omits description of steps that are necessary for manufacturing the liquid crystal display device 1 but have little direct relation to this application, such as a step of sealing the liquid crystal layer, a step of forming peripheral circuits such as the scanning signal drive circuit 211, and a step of mounting the driver IC 21.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A liquid crystal display device, comprising:
an array substrate;
a plurality of pixels sectioned by video signal lines and scanning signal lines formed on the array substrate; and
a plurality of oxide semiconductor layers arranged for each of the plurality of pixels, respectively,
each of the oxide semiconductor layer including a channel semiconductor part disposed on a corresponding one of the scanning signal lines and a pixel electrode part disposed outside the corresponding one of the scanning signal lines in plan view and integrally formed with the channel semiconductor part, at least a part of the pixel electrode part functioning as a pixel electrode,
the pixel electrode part having an electrical conductivity larger than an electrical conductivity of the channel semiconductor part under a state in which a gate voltage is not applied,
the channel semiconductor part being brought into contact with a corresponding one of the video signal lines in a region where the channel semiconductor part, the corresponding one of the video signal lines and the corresponding one of the scanning signal lines overlap each other.

2. The liquid crystal display device according to claim 1, wherein each of the oxide semiconductor layers comprises a metal oxide containing at least one metal element selected from the group consisting of In, Ga, Zn, Sn, Cu, and Cd.

3. The liquid crystal display device according to claim 1, wherein the channel semiconductor part overlaps with corresponding one of the scanning signal lines through intermediation of a gate insulating film in plan view, and
wherein each of the scanning signal lines functions as a gate electrode of a thin film transistor (TFT).

4. The liquid crystal display device according to claim 1 wherein the corresponding one of the scanning signal lines, the channel semiconductor part, and the corresponding one of the video signal lines are overlapped in this order from the array substrate side.

5. The liquid crystal display device according to claim 2 wherein each of the video signal lines includes a metal layer, and
each of the scanning signal lines includes a copper layer mainly containing copper.

6. The liquid crystal display device according to claim 2 wherein each of the video signal lines includes a metal layer, and
each of the scanning signal lines includes a shield layer blocking ultraviolet rays.

7. The liquid crystal display device according to claim 1 further comprising a common electrode formed of a transparent electrode arranged inside each of the plurality of pixels,
the pixel electrode part of the oxide semiconductor layer overlapping with the common electrode through intermediation of an insulating layer.

8. The liquid crystal display device according to claim 7 wherein each of the scanning signal lines includes a transparent layer and a copper layer mainly containing a copper and formed on the transparent layer, and
the transparent layer of the scanning signal line is formed in a same layer as the common electrode.

9. The liquid crystal display device according to claim 1 further comprising a shielding electrode that overlaps with corresponding one of the video signal lines through intermediation of an insulating layer.

* * * * *